(12) United States Patent
Tsironis

(10) Patent No.: US 11,480,610 B1
(45) Date of Patent: Oct. 25, 2022

(54) LOAD PULL PATTERN GENERATION

(71) Applicant: Christos Tsironis, Dollard-des-Ormeaux (CA)

(72) Inventor: Christos Tsironis, Kirkland (CA)

(*) Notice: Subject to any disclaimer, the term of this patent is extended or adjusted under 35 U.S.C. 154(b) by 14 days.

(21) Appl. No.: 17/108,290

(22) Filed: Dec. 1, 2020

(51) Int. Cl.
*G01R 31/28* (2006.01)
*H01P 5/04* (2006.01)

(52) U.S. Cl.
CPC ............. *G01R 31/287* (2013.01); *H01P 5/04* (2013.01)

(58) Field of Classification Search
None
See application file for complete search history.

(56) References Cited

U.S. PATENT DOCUMENTS

| | | | |
|---|---|---|---|
| 5,276,411 A | 1/1994 | Woodin et al. | |
| 6,850,076 B2 * | 2/2005 | Tsironis | G01R 27/32 324/637 |
| 7,135,941 B1 | 11/2006 | Tsironis | |
| 7,248,866 B1 * | 7/2007 | Tsironis | G01R 27/32 333/248 |
| 9,459,336 B1 * | 10/2016 | Tsironis | G01R 35/005 |
| 9,625,556 B1 | 4/2017 | Tsironis | |
| 9,866,203 B1 | 1/2018 | Tsironis | |
| 10,006,951 B1 * | 6/2018 | Tsironis | G01R 27/28 |
| 10,281,510 B1 * | 5/2019 | Tsironis | G01R 31/2822 |

OTHER PUBLICATIONS

Load Pull [online] Wikipedia [Retrieved Nov. 18, 2016] Retrieved from Internet <URL: http://en.wikipedia.org/wiki/Load_pull>.
"Basics of S-Parameters, part 1", Sischka, Franz, Characterization handbook, Mar. 2002.
"Network Analyzer Error Models and Calibration Methods", Doug Rytting, Agilent Technologies, pp. 27-32.
"Network Analyzer Basics,"[online], presentation pp. 49ff, Agilent Technologies [Retrieved Nov. 25, 2020] Retrieved from Internet <URL: https://www.keysight.com/upload/cmc_upload/All/BTB_Network_2005-1 ,pdf>.

* cited by examiner

*Primary Examiner* — Jermele M Hollington

(57) ABSTRACT

A method for instantaneous load pull impedance pattern generation uses a phase-frequency-location equivalent of the natural behavior of slide screw tuners to skew the reflection factor phase with only small frequency changes. The method is generic and applies the same to all GHz range test frequencies. A simple calculation determines the tuning probe position and the impedance cloud is generated quasi instantaneously by switching between sidebands of the carrier test frequency without mechanically moving the tuning probe. Benign frequency behavior of the tuners allows for simple and accurate narrowband interpolation. Duration of load pull measurements is reduced from minutes to seconds.

7 Claims, 11 Drawing Sheets

FIG.1: Prior art

FIG. 2: Prior art (input tuner)

FIG. 8A: Prior art
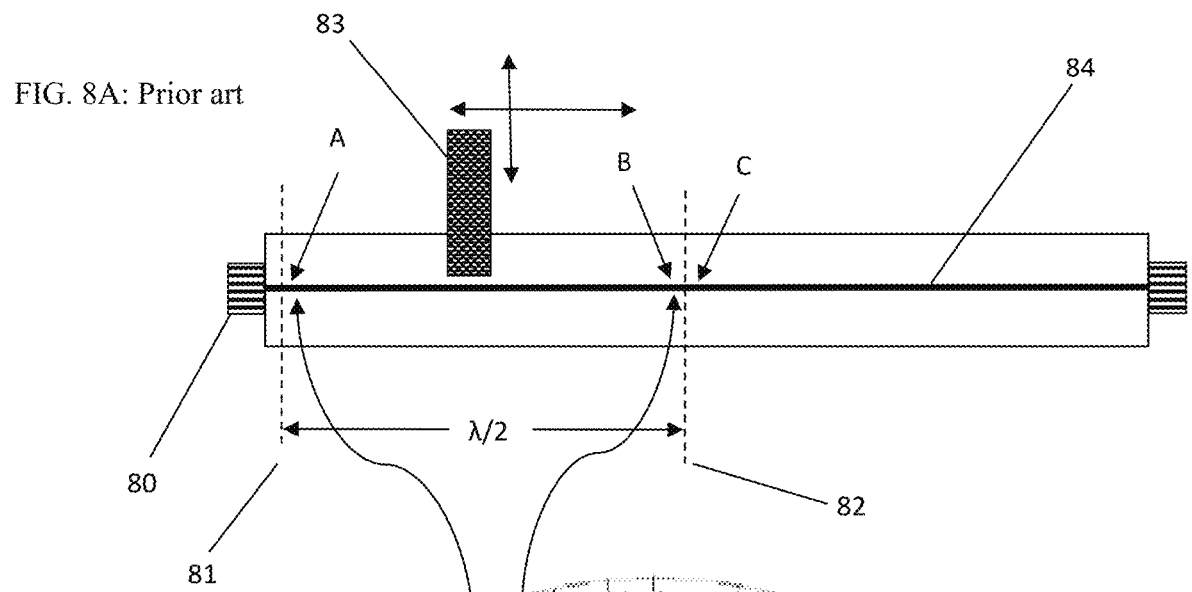
FIG. 8B: Prior art
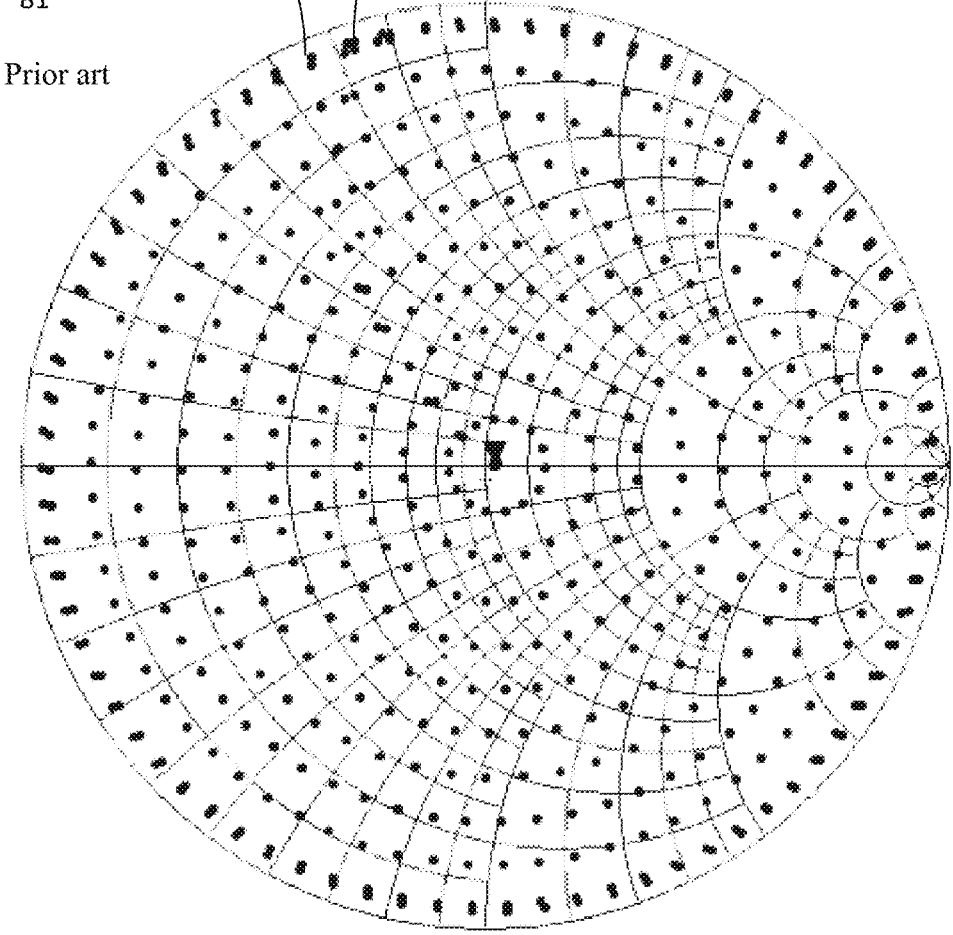

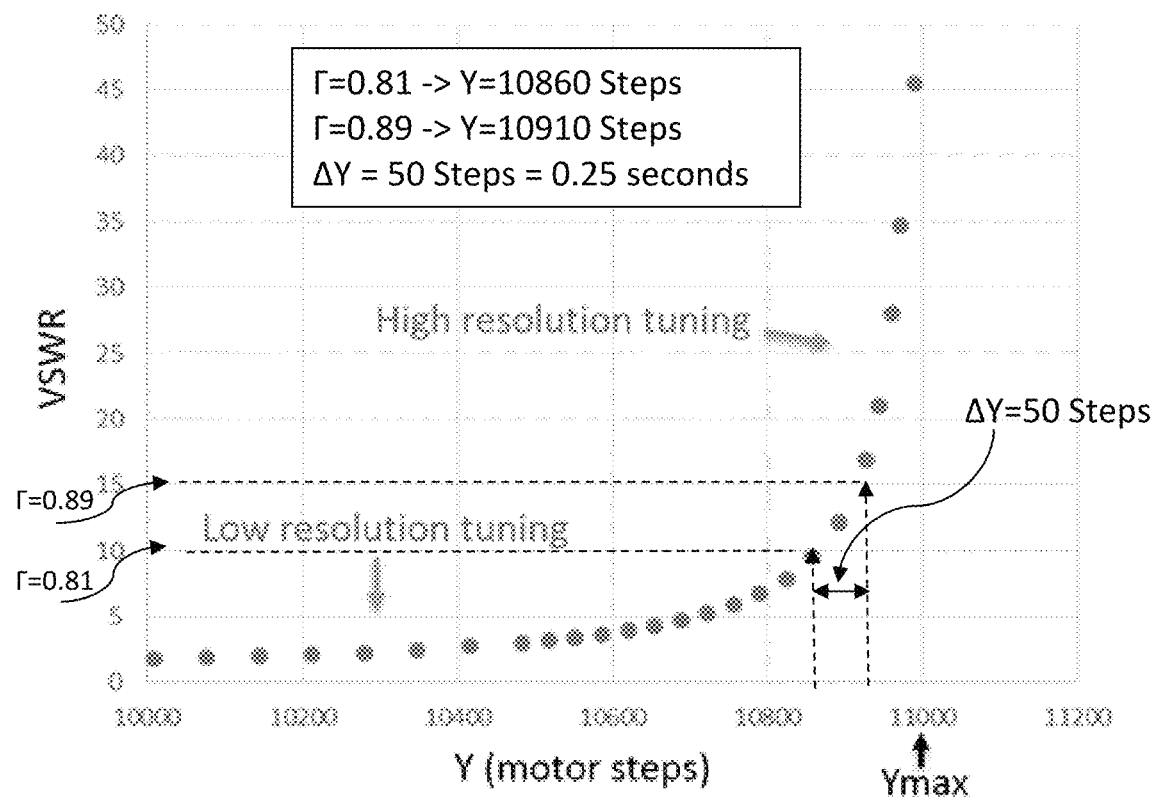
FIG. 9: Prior art

LOAD PULL PATTERN GENERATION

PRIORITY CLAIM

Not Applicable

CROSS-REFERENCE TO RELATED ARTICLES

1. Load Pull [online] Wikipedia [Retrieved 2016 Nov. 18] Retrieved from Internet <URL: http://en.wikipedia.org/wiki/Load_pull>.
2. Tsironis, C. U.S. Pat. No. 9,866,203, "High reliability power tuners", FIG. 6.
3. "Basics of S-Parameters, part 1", SISCHKA, Franz, Characterization handbook, March 2002.
4. Tsironis, C. U.S. Pat. No. 7,135,941, "Triple probe automatic slide screw load pull tuner and method."
5. Woodin, C. et al, U.S. Pat. No. 5,276,411, "High Power Solid State programmable load".
6. "Network Analyzer Error Models and Calibration Methods", Doug Rytting, Agilent Technologies, pages 27-32.
7. "Network Analyzer Basics," [online], presentation pages 49ff, Agilent Technologies [Retrieved 2020 Nov. 25] Retrieved from Internet <URL: https://www.keysight.com/upload/cmc_upload/All/BTB_Network_2005-1.pdf>.
8. Tsironis, C., U.S. Pat. No. 9,625,556, "Method for calibration and tuning with impedance tuners".

BACKGROUND OF THE INVENTION AND PRIOR ART

This invention relates to testing and characterization of RF (radio frequency) transistors (device under test, DUT); the method disclosed here applies to noise and load pull measurements (see ref. 1) using slide screw impedance tuners only. In both cases DC and RF characteristics of the DUT are measured as a function of source and/or load impedance at a specific test frequency in the GHz or high-end (400-1000) MHz frequency range and the collected data are processed, either for generating the four noise parameters or load pull ISO contours.

A typical test setup is shown in FIG. 1; it uses a remotely controlled RF signal source, slide screw impedance tuners and a signal receiver; the tuners synthesize source and/or load reflection factors $\Gamma_S$ or $\Gamma_L$ at the input and/or the output of the DUT and allow collecting the necessary data using the signal receivers. This is done by moving a metallic (reflective) tuning probe inside the slot of a slotted airline (slabline), horizontally along the slabline between an initial position X=0 and X=λ/2 (half a wavelength) and vertically between full withdrawal Y=1:1 and maximum insertion Y=$Y_{MAX}$ and proximity to the center conductor and creating this way impedance patterns as shown in FIG. 8B.

BRIEF DESCRIPTION OF THE INVENTION

All prior art load and source pull techniques (see ref. 5) using mechanical tuners suffer from the fact that such tuners are relatively slow: mechanical probe movement, especially horizontal movement along the transmission line, required to change the phase of the reflection factor, is slow; it can take, depending on the test frequency, several seconds (up to 15 seconds, depending on the measurement frequency: the lower the frequency, the longer it takes) per impedance point, whereas a few vertical steps are enough to change the amplitude of the reflection factor significantly (see FIG. 9 and ref. 2). This invention discloses a much faster reflection factor generation method (FIG. 11), which takes advantage of two facts: (a) the natural behavior of slide screw tuners, of which the reflection factor $\Gamma=|\Gamma|*\exp(j\Phi)$ rotates fast with frequency, due to the long transmission lines between tuning probe and DUT, and has quasi constant amplitude over large frequency bands (FIG. 6), and (b) the fact that the RF parameters of intrinsic transistors, i.e. excluding matching and resonant circuits, have smooth and low gradient dependence on frequency.

Therefore, the required change in phase of the source or load reflection factor $\Gamma_S$ or $\Gamma_L$ can be created by slightly changing the measurement frequency around a center test frequency, while assuming that in this narrow frequency band the RF parameters are constant. Or, the method consists in measuring RF characteristics of the DUT at a fixed frequency F (as an example, F may vary between, 1 and 26 GHz) and a number 2K of sidebands around F i.e. a total of 2K+1 points, at intervals SF (for instance up to ±5 or ±10*δF, δF being in the low MHz range) without moving the tuner, and assume that, in this narrow frequency band (F−K*δF≤F≤F+K*δF) the RF parameters of the DUT are approximately constant, whereas the source or load reflection factor is spread over a pattern area (FIGS. 3 and 7). This allows collecting enough data points to extract the RF ISO contours without moving the tuning probe horizontally. The only tuner movement required is three or more vertical tuning probe movements of a few motor steps required to create concentric circles (TUNER STATES TS.1, TS.2, ... TS.M, FIG. 3), which takes, typically, a small fraction of one second, at vertical motor rotation speed of 200 steps/second (see also FIG. 9).

DESCRIPTION OF THE DRAWINGS

The invention and its mode of operation will be more clearly understood from the following detailed description when read with the appended drawings in which:

FIG. 8A through 8B depict prior art; tuning probe travel to reach adjacent reflection factors; FIG. 8A depicts slabline and probe movement; FIG. 8B depicts calibration points on the Smith chart.

FIG. 9 depicts prior art, reflection factor as a function of tuning probe penetration into the slabline; the insert shows the referred to structure.

DETAILED DESCRIPTION OF THE INVENTION

Figure 1:
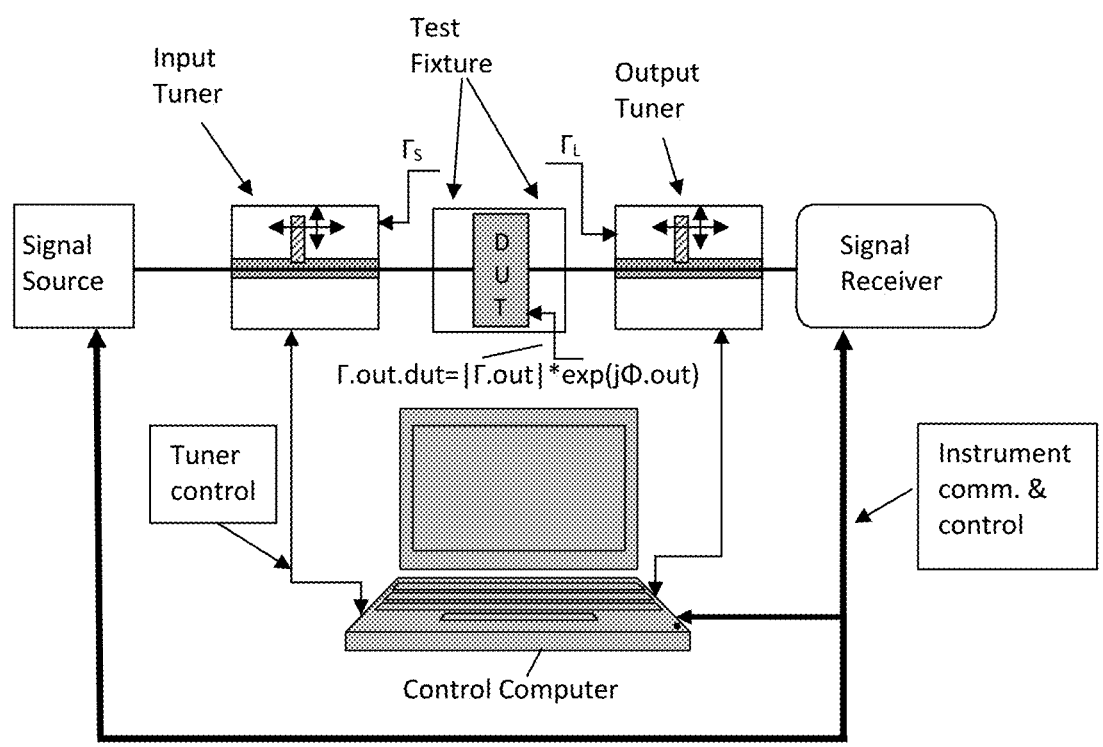
FIG. 1 depicts prior art, the basic configuration of load/source pull measurement system using input and output slide screw impedance tuner.
Figure 2:
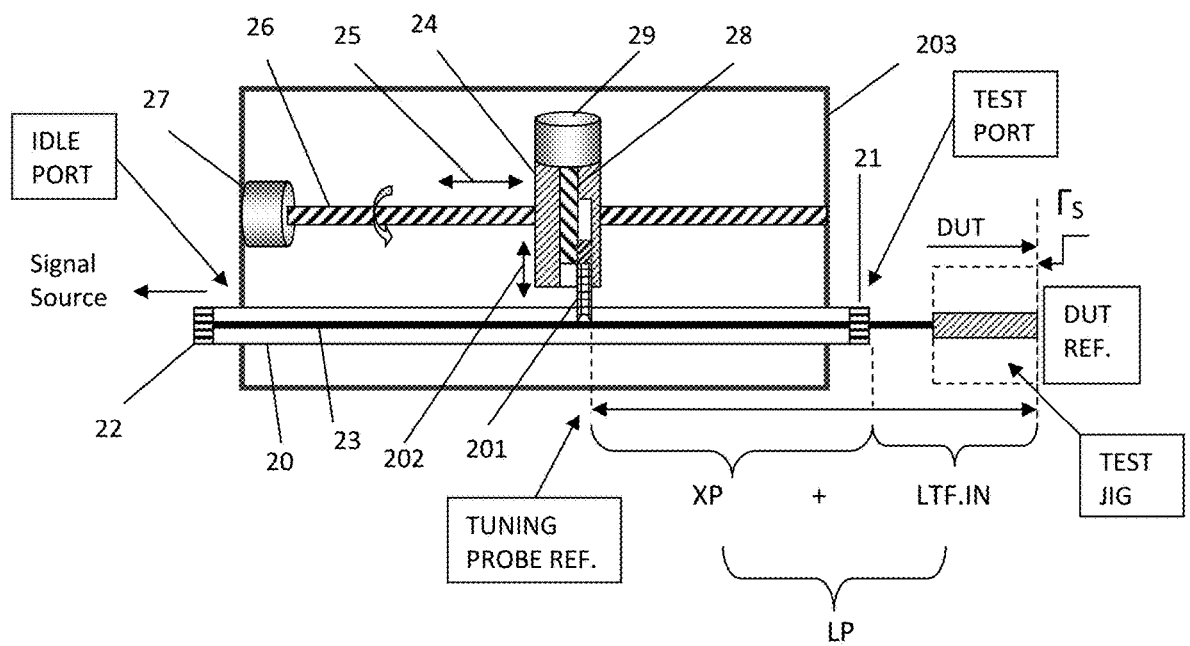
FIG. 2 depicts prior art, the structure and relevant dimensions of an input slide screw tuner, connected to test fixture and DUT.
Figure 5:
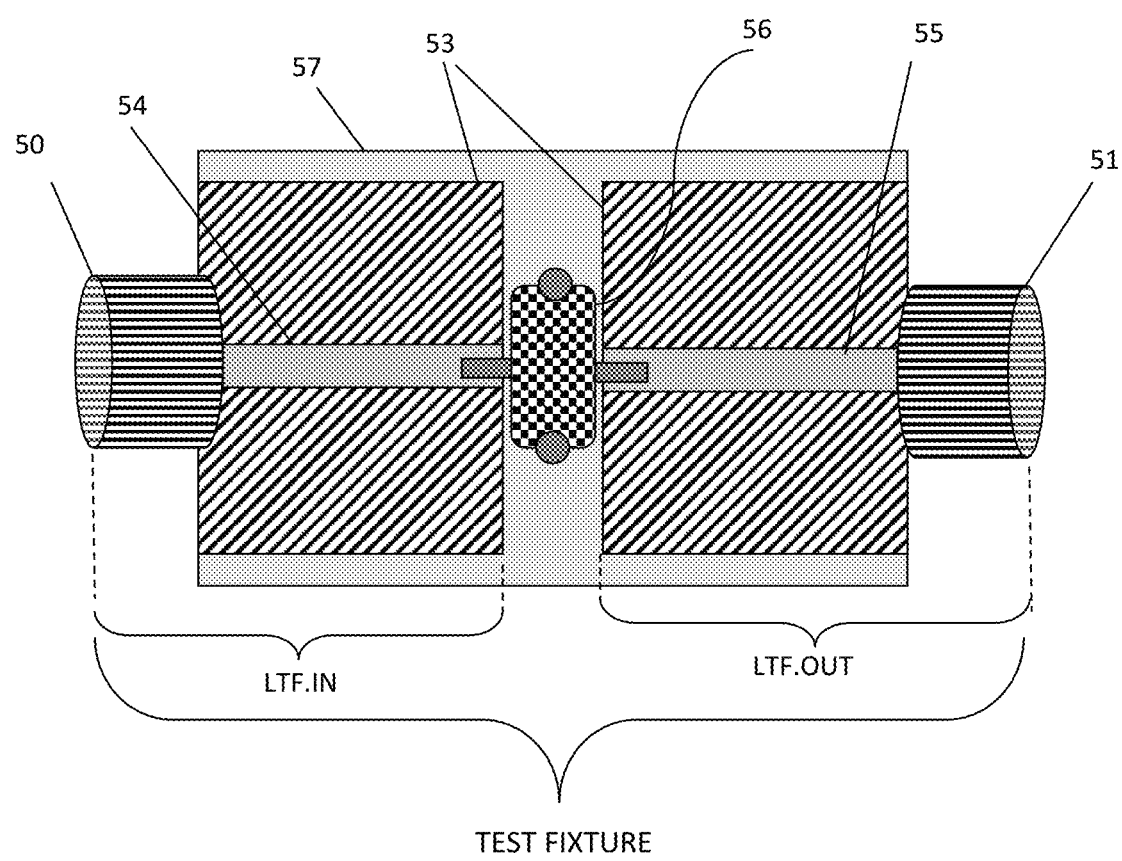
FIG. 5 depicts prior art, a test fixture for packaged transistors including an input and an output microstrip section.

FIG. 2 shows the typical structure of an automated slide screw source (input) impedance tuner connected, using a test jig (fixture), to the input port of a DUT. A load (output) tuner is symmetrical (test port is the input port and idle port is the output port, the signal always flows from left to right in such a cascade). The source tuner shown in FIG. 2 includes a slotted airline (slabline) 20 with an output (test) port 21, an input (idle) port 22 and a center conductor 23. In the case of a load tuner the test port is the input port and the idle port is the output port, and the test port is connected, via the test fixture, to the DUT output port. A mobile remotely controlled carriage 24 slides horizontally along the slabline and is driven 25 by a lead screw 26 controlled by a stepper motor 27. The carriage 24 includes a remotely controlled vertical axis 28, which is controlled by a vertical stepper motor 29 and carries a reflective probe 201, perpendicularly insertable into the slot of the slabline 20 and capacitively coupled with the center conductor 23 and movable vertically 202; the whole is mounted inside a solid housing 203. The electrical distance LP between the tuning probe and the DUT, consisting of the segment inside the tuner (XP) and the input section of the test fixture (LTF.IN) between the test port 21 and the DUT, is the core and the critical parameter of the method, allowing, if properly selected, efficient load/source pull measurements with minimum mechanical tuner movement. In the case of the output tuner the test fixture section to be considered is the output section LTF.OUT (FIG. 5).

The distance between the concave bottom of the tuning probe 201 and the center conductor 23 (insert in FIG. 6 and FIG. 3 in ref. 4), determines the amplitude |Γ| of the reflection factor of the tuner at the test port 21. This is depicted in FIG. 9. It is shown that at medium to high reflection factors (VSWR between 10:1 (|Γ|=0.81) and 15:1 (|Γ|=0.89) the vertical movement ΔY required is only 50 motor steps, corresponding to about 75 micrometers (=1.5 μm/step). For this movement the stepper motor, which rotates at a speed of 200 steps per second, will require only 250 milli-seconds, whereas a horizontal movement of several centimeters will require several seconds (depending on the gear used, typical travels are between 500 and 5000 steps or 10 to 100 times longer than the vertical movement). The aim of this invention is to configure the system, such that, for the whole measurement session only a few fast-vertical tuning probe movements will be required.

Figure 4:
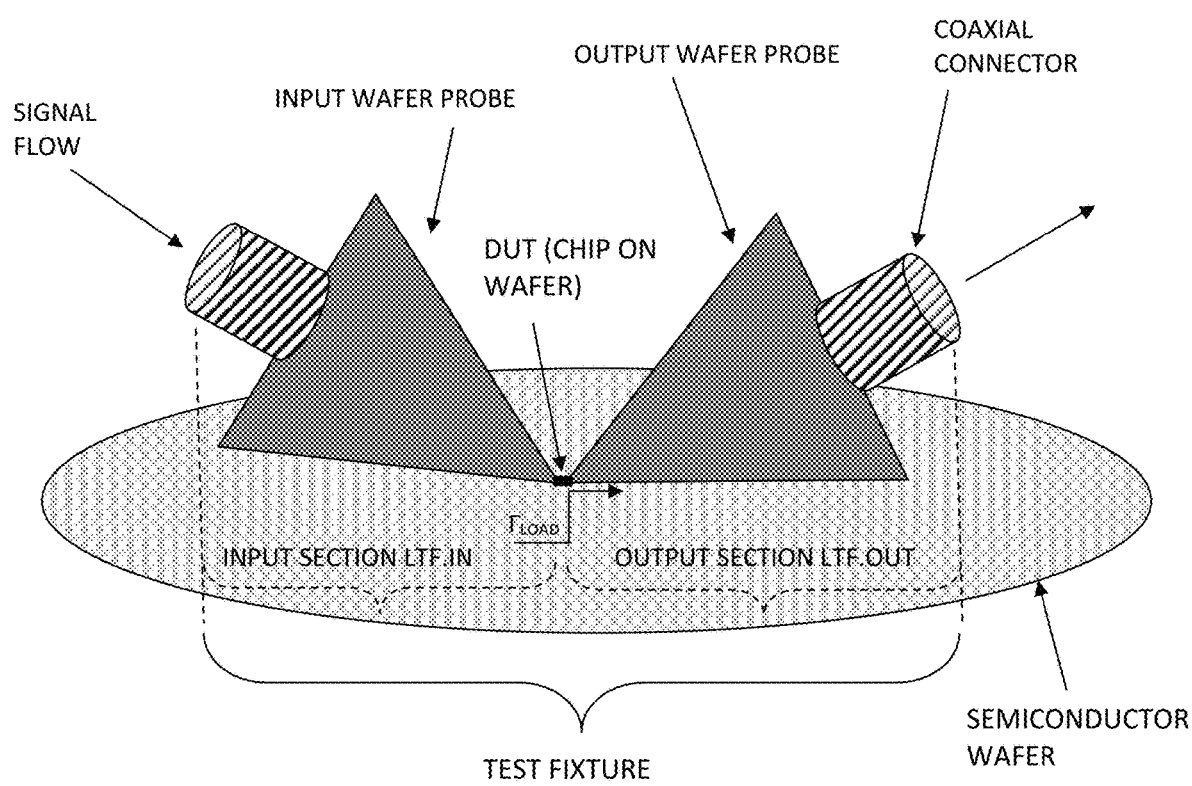
FIG. 4 depicts prior art, a test fixture for semiconductor chips on-wafer employing an input and an output wafer probe.

A packaged transistor (DUT), 56 is always mounted in a test fixture. If it is in chip form, it is part of a semiconductor wafer. In the first case the test fixture used (FIG. 5) includes an input 50 and an output 51 port, input and output sections 53 with input 54 and output 55 microstrip transmission lines connecting the ports to the DUT; the whole test fixture is mounted on a platform 57. A wafer chip is accessed directly using wafer probes (FIG. 4). In this case the wafer probes themselves act as input and output sections of a test fixture.

In both cases for the tuning and measurements to be referred to the DUT ports, the test fixture is calibrated using a vector network analyzer (VNA, see ref. 7) and a number of calibration standards, like a SHORT, a LINE, an OPEN and a LOAD and saved in setup calibration file, which includes scattering (s-) parameters of the input and output sections of the test fixture, for later de-embedding (see ref. 6).

The purpose of load pull measurements is to be able to generate ISO contours 71 around the optimum reflection factor Γopt 72. Γopt is the conjugate complex of Γ.out=|Γ.out|*exp(−jΦ.out), whereby Γ.out is the output large signal reflection factor of the DUT; for this the approximate phase Φ.out (FIG. 3) for a frequency F requires the total length LP (FIG. 2) to be selected such that |2Nπ+Φ.out|=4π*LP/λ=4π*LP/(300/F), whereby LP is in mm and F is in GHz, and N is an integer 0, 1, 2, 3 . . . ; as an example, for Φ.out=60°=π/3 and F=2 GHz, follows LP=12.5 mm for N=0, and for N=1: Φ.out=2π+π/3 follows LP=87.5 mm. This is because of the 2π periodicity of the reflection factor and dictates the choice of tuning probe position TP to be added to TF to match either the TF+TP=12.5 mm or TF+TP=87.5 mm; given that TF=constant, this can only be achieved through moving the tuning probe (TP).

Figure 7:
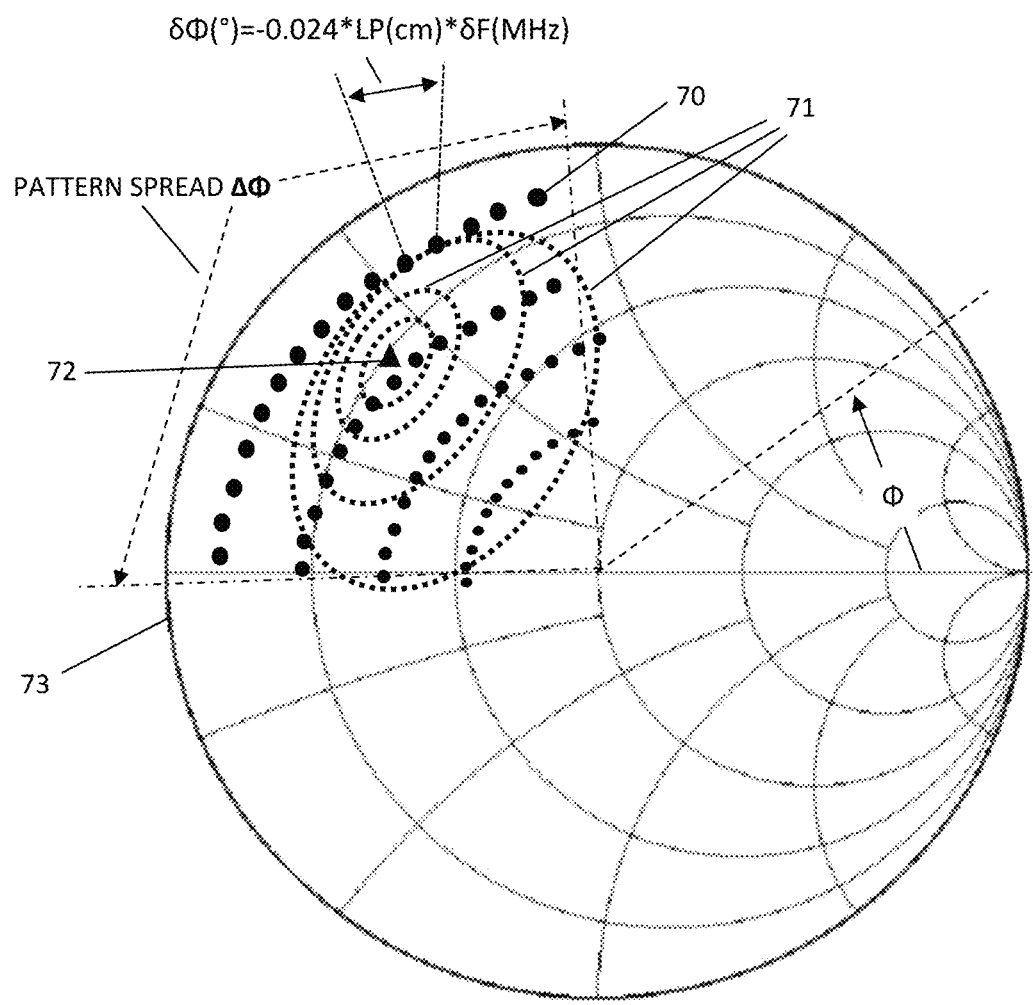
FIG. 7 depicts load pull reflection factor pattern spread and associated load pull ISO contours.
Figure 10:
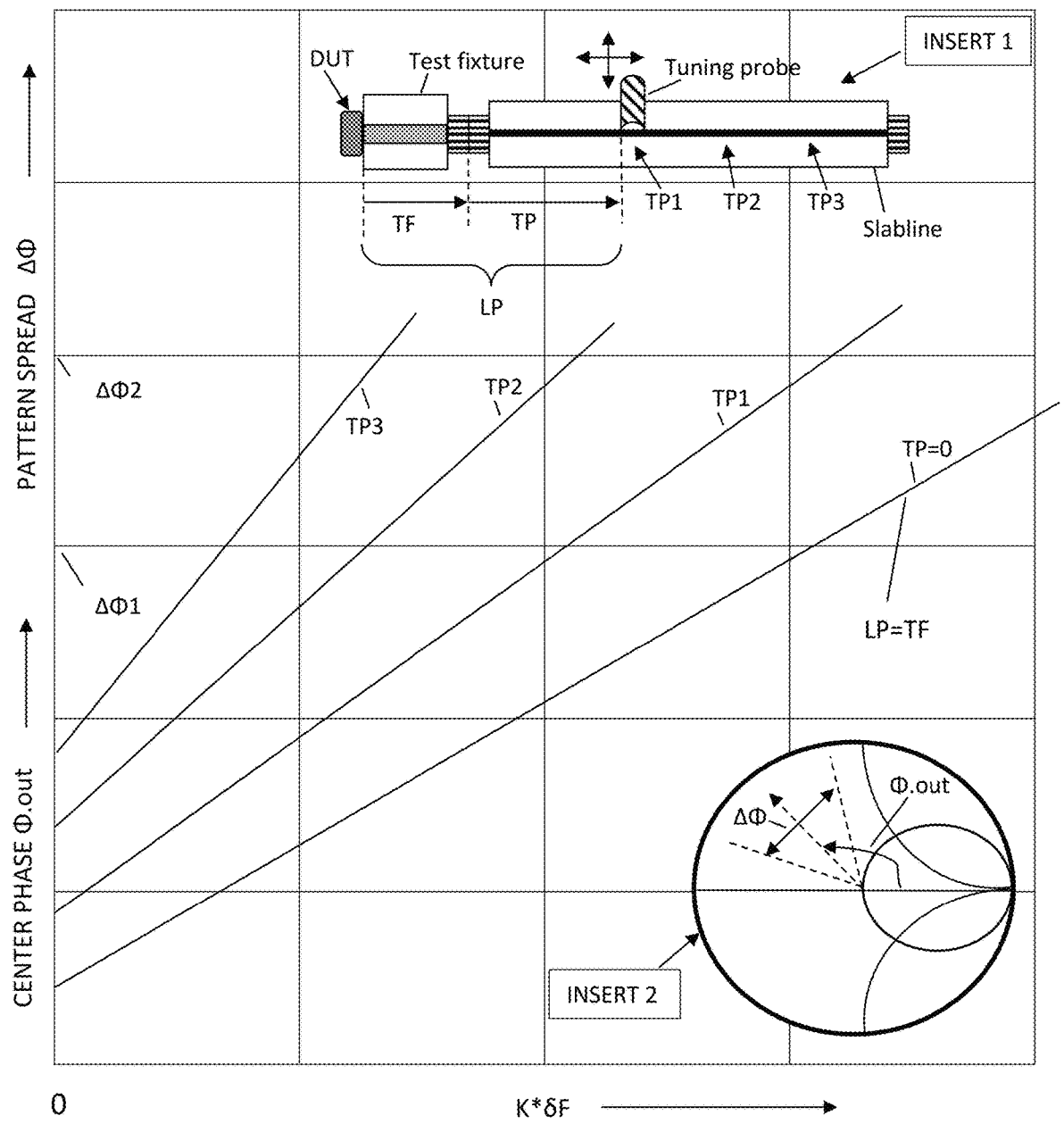
FIG. 10 depicts the center phase Φ.out and load pull pattern total spread ΔΦ as a function of frequency sweep K*δF and various horizontal tuning probe positions (TP1>TP2>TP3 . . . ); insert 1 shows the associated geometry; insert 2 shows the definitions of center phase Φ.out and phase spread ΔΦ.

The following step is creating appropriate phase spread ΔΦ of the reflection factor around Φ.out through phase steps δΦ and number of sidebands K at center frequency F for the total sector (pattern) spread ΔΦ=K*δΦ (FIG. 7) of points 70 on the Smith chart 73. The pattern in FIG. 7 is spread around the optimum reflection factor 72 and includes 15 sidebands (K=2*7+1) for ΔΦ≈90° or δΦ≈6°. From the relation δΦ(°)=−0.024*LP (cm)*δF (MHz) follows, for the previous example, δF(LP=12.5 mm)=20 MHz and δF(LP=87.5 mm)=2.86 MHz. In all cases the center frequency F is irrelevant, the spread ΔΦ is the same(90°) and the number of sidebands (or load pull points) is the same (2K+1=15). The only thing that changes is the electric length LP between DUT and tuning probe, and this can be adjusted through the horizontal position of the tuning probe TP (FIG. 10). The benefit is immediately visible: Smaller δF means smaller frequency change and DUT characteristics spread and more accurate calibration point interpolation around F.

In addition to the frequency sweeping creating the pattern spread, a number of arcs of various radii are required to create the full pattern (FIG. 7); this, as already mentioned, is created by changing the penetration of the tuning probe to various depths Y1, Y2, Y3 . . . YM. Herein M is the user-defined number of arcs considered sufficient for accurate measurement. In any case the values Yi vary by only a few steps (FIGS. 6 and 9); the values Yi are retrieved from the tuner calibration file (see ref. 8). In general patterns start at |Γ| equal or lower than 0.2 and reach mostly as high as the tuning range of the tuner reaches, i.e. 0.8 to 0.9.

Figure 6:
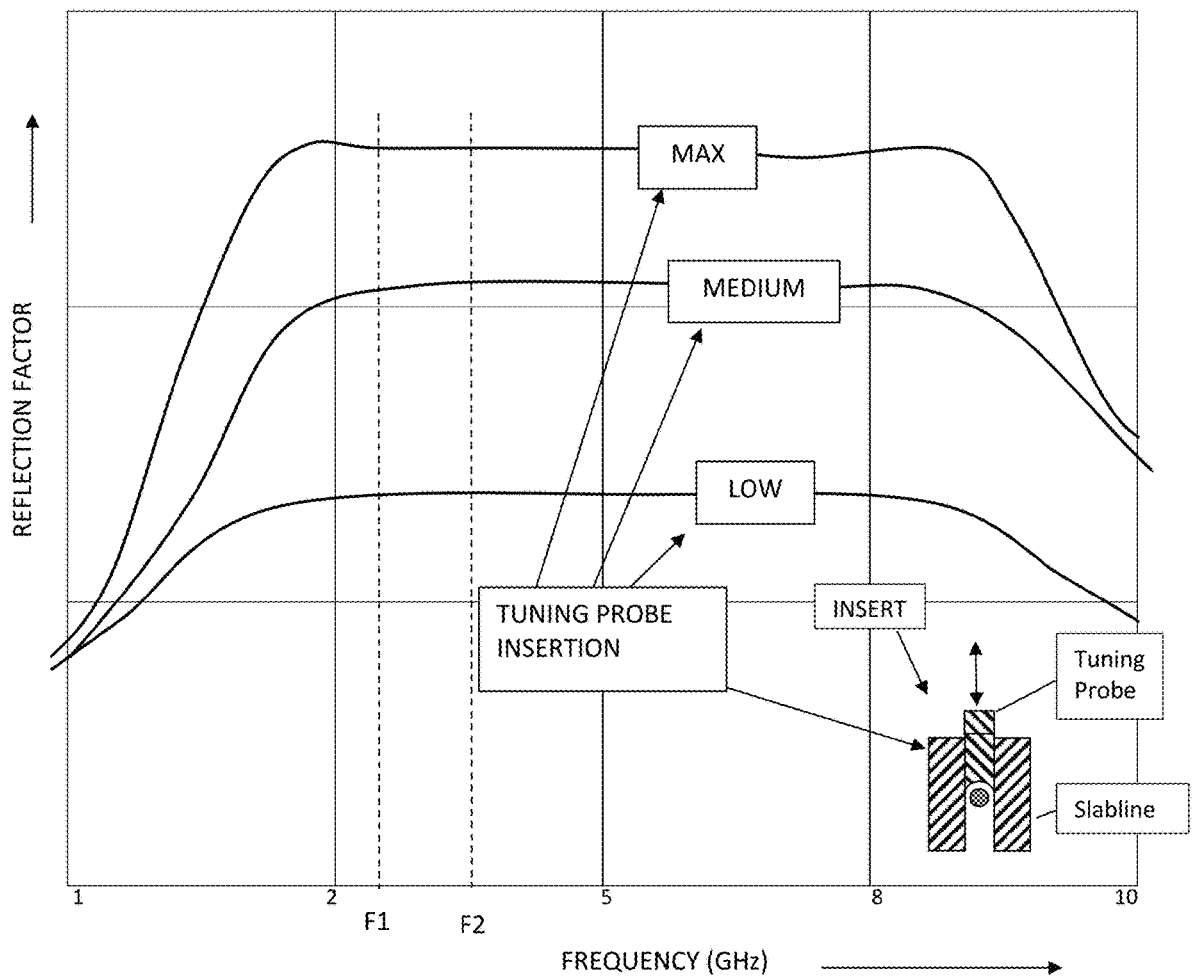
FIG. 6 depicts prior art, reflection factor |Γ| (or VSWR, |Γ|=(VSWR−1)/(VSWR+1)) of slide screw tuner as a function of probe insertion (in motor steps, 1 step=1.5 micrometer).

To be usable, the method requires (a) the tuner to be calibrated at a test frequency F and (b) a basic frequency interpolation of the calibration points (see ref. 8, FIGS. 2, 8 and 12, column 5). Calibration points are s-parameter sets of the tuner two-port, measured at a single frequency for a multitude of horizontal and vertical positions of the tuning probe (FIG. 8B). The tuner is calibrated (i.e. the s-parameters Sij, {i,j}={1,2} of the tuner two-port are measured and saved), at the multitude of horizontal and vertical positions of the tuning probe inside the slot of the slabline. The range of horizontal and vertical tuning probe movement is called horizontal and vertical calibration range and it covers, typically, horizontal movement from X=0 to X=λ/2 and vertical movement from Y=0 (withdrawal) for minimum reflection, to Y=$Y_{MAX}$ close to the center conductor for high reflection. The points shown in all graphs in this disclosure show the reflection factor S11 at the test port, when the opposite (idle) port is terminated with the characteristic impedance of the slabline (Zo=50Ω), see ref. 8. This is simple enough for the slide screw tuner, since its frequency dependent behavior is benign as seen by FIG. 6 and the reflection inside the transmission line strictly follows the equation $\Phi = \Phi 11 = -4\pi \ast LP/\lambda \ast F$, or the amplitude of the reflection factor is quasi constant for a large frequency band of several GHz and the phase $\Phi$ is strictly proportional to the frequency F. S-parameter (see ref. 3) interpolation thus follows a simple three point rule between any two adjacent calibration frequencies F1 and F2 (FIG. 6): Sij(F1+δF)=Sij(F1)+δF*(Sij(F2)−Sij(F1))/(F2−F1) executed in real and imaginary parts of Sij=Re(Sij)+j*Im(Sij): Re(Sij(F1+δF))=Re(Sij(F1))+δF*[Re((Sij(F2))−Re(Sij(F1))]/(F2−F1) and the same for Im(Sij( )).

Figure 3:
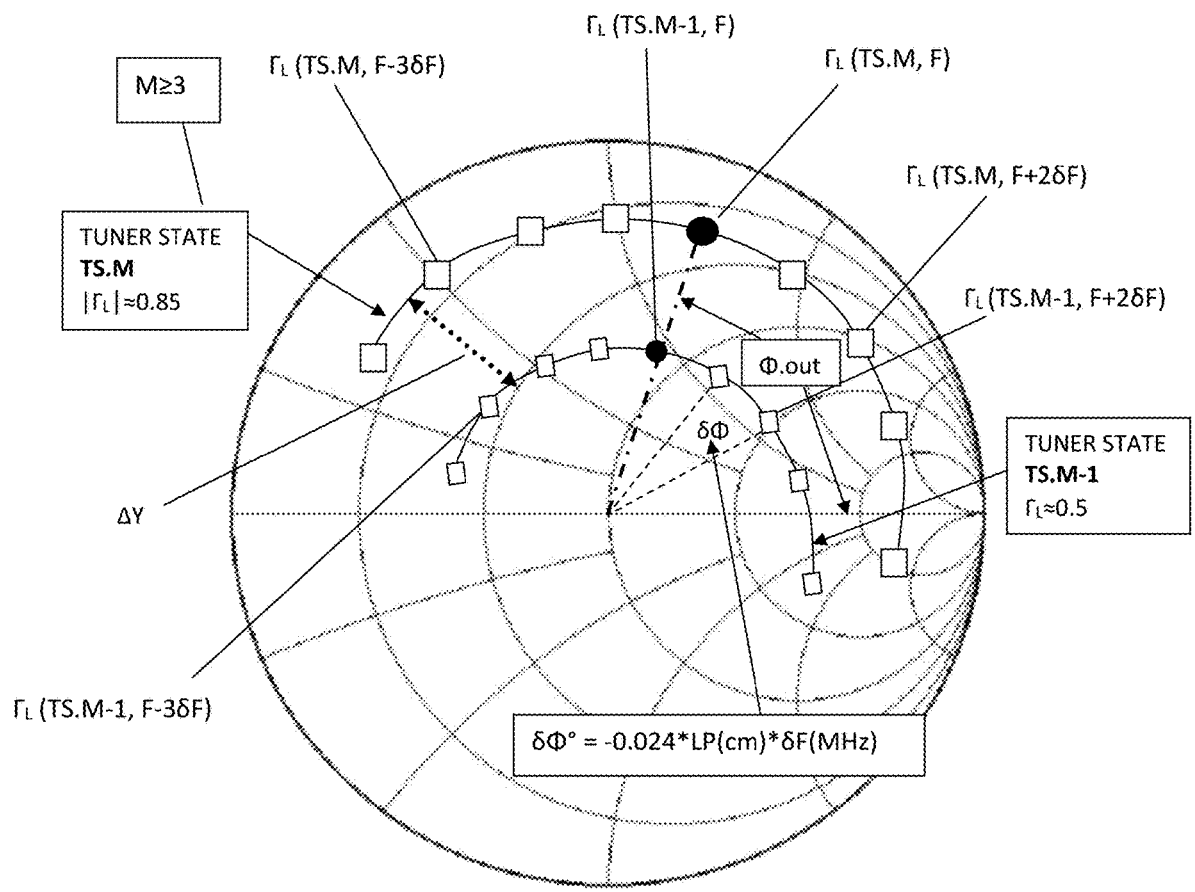
FIG. 3 depicts impedance (reflection factor) generation by sweeping frequency and moving tuning probe only vertically.
Figure 11:
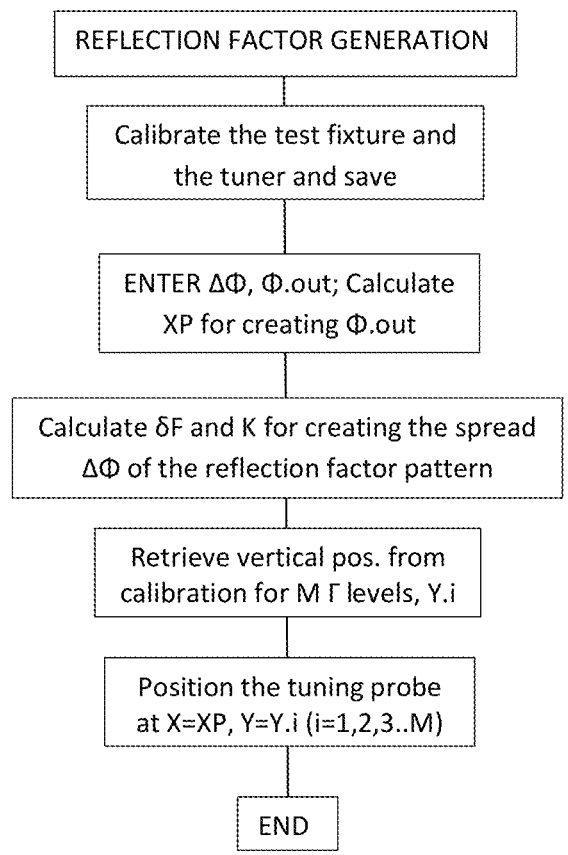
FIG. 11 depicts the reflection factor generation algorithm for calculating the probe position XP to match Φ.out and the frequency step δF and number of steps K to create the load pull pattern spread ΔΦ.

Maybe this unconventional mode of operation (FIG. 11) needs some further clarification: as the measurement frequency is swept in small steps around a center frequency F for a total bandwidth of 5 to 20 MHz, for example, from F−10 MHz in K (10≤K≤15) steps up to F+10 MHz, the reflection factor $\Gamma_L$ rotates (FIG. 3). A measured DUT parameter P (=Gain, Power, Efficiency etc.) changes accordingly. However, since the specific parameter P changes very little as a function of frequency within this small frequency band of 20 MHz, we can assume that P(F)≈constant within F±20 MHz, instead P changes much more as a function of $\Gamma_L$ (FIG. 7); this allows generating, numerically, the contours 71. It is crucial to recognize here (FIG. 7) that the reflection factor dots 70 are each at a slightly different frequency F±j*δF. The specific method works only when slide screw tuners are used to measure wideband components, like transistors. The method is not applicable when using electronic tuners (see ref. 5) or measuring resonant components (like filters). A simple estimate underlines this fact: The Gain of a typical transistor may vary by 1 dB per GHz (worst case scenario, in the area of usefulness of the device). The associated change in a 20 MHz frequency band is 0.02 dB. The change in Gain, caused by a 45° change in angle $\Phi$ of the load reflection factor $\Gamma$ (FIG. 7) instead, exceeds 3 dB, a typical ratio of 150:1. It is therefore legitime to use this method, since $\Delta P(\Gamma_L(F\pm\delta F)) \gg \Delta P(F\pm\delta F)$.

FIGS. 8A and 8B demonstrate the importance of the method in reducing tuning time when the adjacent target impedances are at the limits of the calibration area. The tuners are calibrated at the test port 80 over a range of one half of a wavelength between plans 81 and 82, allowing 360° reflection factor coverage (FIG. 8A), moving the tuning probe 83 along the center conductor 84. Moving between calibration points (FIG. 8B) seems a short distance taking little time, except if the seemingly adjacent points A and B are at the beginning and the end of the calibration range. This happens because the tuner cannot move from point B to close-by point C, since point C is uncalibrated and outside the calibration range. So, the tuner has to go back all the way to point A, a process that can take dozens of seconds, especially at lower frequencies (large wavelengths). Instead a frequency jump by 20 MHz, causing the same impedance jump, is quasi instantaneous without any mechanical movement.

FIG. 10 finally shows, graphically, how moving the tuner probe further down along the slabline to positions TP3>TP2>TP1 can reduce the requirement for a frequency change δF in order to reach a pattern opening of $\Phi 1$ or $\Phi 2$ while keeping the number of points on each arc segment, i.e. the measurement points, constant: The further the tuning probe is from the DUT, the smaller a frequency change is needed. The hitherto method of load pull, keeping the frequency constant, instead, starts at the origin of the plot (δF=0) and requires a considerable movement of the tuning probe.

This invention discloses an alternative method for creating a load or source pull impedance pattern using slide screw tuners, whereby, instead of moving the tuning probe to change the phase of the reflection factor at constant frequency, we change slightly the frequency and keep the tuning probe immobile. The test time is reduced from minutes to seconds.

What is claimed is:

1. A method for generating a load pull reflection factor pattern comprising:
   a slide-screw impedance tuner having
      a test port and an idle port,
      a slabline between the ports, and
      a tuning probe insertable into the slabline,
   a test fixture having an input port and an output port, and
   a reflection factor pattern generation algorithm;
   wherein
      either port of the test fixture is connected with the test port of the tuner;
   and wherein
      the reflection factor pattern generation algorithm comprises:
      i) calibrate the test fixture and the tuner at a frequency F and a horizontal Xi and vertical Yi range of positions of the tuning probe and save,
      ii) enter a target phase Φ.out and a pattern phase spread ΔΦ of the reflection factor,
      iii) calculate a horizontal position XP of the tuning probe for creating the phase Φ.out of the reflection factor at a DUT reference plane,
      iv) calculate a frequency step δF and a number of steps K required for creating the phase spread ΔΦ of the reflection factor pattern around Φ.out,
      v) retrieve vertical positions Y1, Y2 . . . Yi . . . YM for M≥3 reflection factor levels from the tuner calibration in step i),
      vi) position the tuning probe at the positions XP and Yi determined in steps iii) and v).

2. The method for generating a load pull reflection factor pattern of claim 1,
   wherein
      the test fixture comprises:
         input and output sections of transmission line inserted between the corresponding test fixture ports and a DUT having an input and an output port, said sections of transmission line connecting the input port of the test fixture with the input port of the DUT and the output port of the DUT with the output port of the test fixture.

3. The method for generating a load pull reflection factor pattern of claim 1,
   wherein
      the phase of the reflection factor created by the tuner at DUT reference plane equals the negative of a phase−|Φ.out| of an output reflection factor of the DUT;
   wherein
      the tuner probe position is calculated using LP=|Φ.out|*λ/(4*π)+N*λ/2, wherein LP includes the electric lengths of the test fixture output section (LTF.OUT) and the slabline section between the test port and the tuning probe (XP) of the tuner and N is an integer generating a length XP=LP-LTF.OUT within the horizontal position range of the tuning probe;

and wherein the frequency offset δF and number of adjacent sidebands K is calculated to create the pattern spread ±ΔΦ/2 of the reflection factor Γ=|Γ|*exp(jΦ)) as follows: δF=ΔΦ/(4π*LP*K).

4. The method for generating a load pull reflection factor pattern of claim 1, wherein the test fixture comprises: at least two wafer probes, wherein an input wafer probe corresponds to the input section of the test fixture and an output wafer probe corresponds to the output section of the test fixture.

5. The method for generating a load pull reflection factor pattern as in claim 1 or 3 comprising:

setting a signal source to a frequency F and adjacent sidebands to F±j*δF for (2<j≤K), at M tuner settings, TS.1, TS.2 ... TS.i ... TS.M;

wherein all tuner settings TS.i comprise the same horizontal tuning probe position XP;

TS.1 comprises vertical position of the tuning probe creating reflection factor |Γ(TS.1)|≤0.2;

TS.i for i>1 comprises vertical position of the tuning probe creating reflection factor |Γ(TS.i)|≈i/(M+1).

6. The method for generating a load pull reflection factor pattern of claim 1, wherein the impedance tuner is an input tuner and is inserted between a signal source and the input section of the test fixture, and wherein the output port of the tuner is the test port and is connected to the input port of the test fixture.

7. The method for generating a load pull reflection factor pattern of claim 1, wherein the impedance tuner is an output tuner and is inserted between the output section of the test fixture and a load, and wherein the input port of the tuner is the test port and is connected to the output port of the test fixture.

* * * * *